(12) United States Patent
Merilo et al.

(10) Patent No.: US 7,535,086 B2
(45) Date of Patent: May 19, 2009

(54) INTEGRATED CIRCUIT PACKAGE-ON-PACKAGE STACKING SYSTEM

(75) Inventors: Dioscoro A. Merilo, Singapore (SG); Heap Hoe Kuan, Singapore (SG); You Yang Ong, Singapore (SG); Seng Guan Chow, Singapore (SG); Ma. Shirley Asoy, Singapore (SG)

(73) Assignee: STATS ChipPac Ltd., Singapore (SG)

( * ) Notice: Subject to any disclaimer, the term of this patent is extended or adjusted under 35 U.S.C. 154(b) by 160 days.

(21) Appl. No.: 11/462,320

(22) Filed: Aug. 3, 2006

(65) Prior Publication Data

US 2008/0029858 A1    Feb. 7, 2008

(51) Int. Cl.
*H01L 23/495* (2006.01)
*H01L 23/48* (2006.01)
*H01L 21/00* (2006.01)

(52) U.S. Cl. .......... 257/676; 257/666; 257/685; 257/686; 257/696; 257/777; 257/778; 257/E25.013; 257/E25.023; 438/109; 438/111; 438/113; 438/123

(58) Field of Classification Search .......... 257/666, 257/685, 686, E25.013, E25.023, 777, 778, 257/676, 696; 438/109, 111, 113, 123
See application file for complete search history.

(56) References Cited

U.S. PATENT DOCUMENTS

| | | | |
|---|---|---|---|
| 6,396,134 B2 * | 5/2002 | Kinsman | 257/676 |
| 6,518,659 B1 | 2/2003 | Glenn | |
| 6,603,072 B1 | 8/2003 | Foster et al. | |
| 6,627,990 B1 | 9/2003 | Shim et al. | |
| 6,667,544 B1 | 12/2003 | Glenn | |
| 6,798,057 B2 | 9/2004 | Bolkin et al. | |
| 6,861,288 B2 | 3/2005 | Shim et al. | |
| 6,897,553 B2 | 5/2005 | King et al. | |
| 6,899,534 B2 | 5/2005 | Tandy | |
| 7,195,957 B2 * | 3/2007 | Koon et al. | 438/124 |
| 7,217,994 B2 | 5/2007 | Zhu et al. | |
| 7,245,007 B1 * | 7/2007 | Foster | 257/678 |
| 2006/0261461 A1 * | 11/2006 | Roeters et al. | 257/686 |
| 2008/0036034 A1 * | 2/2008 | Juskey et al. | 257/531 |

* cited by examiner

*Primary Examiner*—Long K Tran
(74) *Attorney, Agent, or Firm*—Mikio Ishimaru

(57) ABSTRACT

An integrated circuit package-on-package stacking system is provided including, forming a leadframe interposer including: forming a leadframe; forming a molded base on the leadframe; and singulating the leadframe interposer from the leadframe.

8 Claims, 5 Drawing Sheets

INTEGRATED CIRCUIT PACKAGE-ON-PACKAGE STACKING SYSTEM

TECHNICAL FIELD

The present invention relates generally to integrated circuit package systems, and more particularly to a system for integrated circuit package systems having stacked packages.

BACKGROUND ART

In order to interface an integrated circuit with other circuitry, it is common to mount it on a lead frame or substrate. Each integrated circuit has bonding pads that are individually connected to the lead frame's lead finger pads using extremely fine gold or aluminum wires. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as PC's, compute servers, and storage servers, need more integrated circuits in the same or smaller "real estate". Particularly acute, the needs for portable personal electronics, such as cell phones, digital cameras, music players, PDA's, and location-based devices, have further driven the need for integrated circuit density.

This increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a PCB substrate onto which a set of separate integrated circuit components is directly attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. Moreover the substrate and integrated circuit are often damaged during assembly or testing, complicating the manufacturing process and increasing costs. The vertically stacked integrated circuit problems can be greater than the benefits.

There are design limitations presented by package stacks as well. In many of the stacked structures, the top package is not able to have system interconnects in the center as this area is usually consumed by the plastic package cover of the lower device. In the push for more integrated function, this limitation may stop a design from using the package type. Package overlaps have long been a barrier to additional interconnects, which can be a problem in a device that has a high number of interconnects around the outside of the package.

Thus, a need still remains for improved packaging methods, systems and designs. In view of the shrinking size of consumer electronics and the demand for more sophisticated functions in the restricted space, it is increasingly critical that answers be found to these problems. In view of the ever increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package-on-package stacking system comprising, forming a leadframe interposer including: forming a leadframe, forming a molded base on the leadframe, and singulating the leadframe interposer from the leadframe; providing a base integrated circuit package with the leadframe interposer mounted thereon; and providing an upper integrated circuit package on the leadframe interposer.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
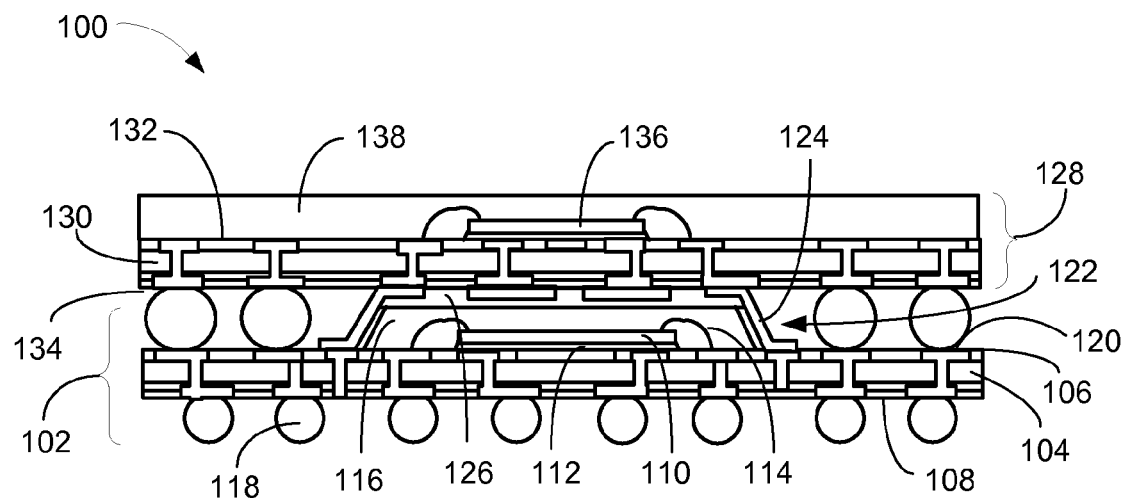
FIG. 1 is a cross-sectional view of an integrated circuit package-on-package stacking system, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGS. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an integrated circuit package-on-package stacking system 100, in an embodiment of the present invention. The cross-sectional view of the integrated circuit package-on-package stacking system 100 depicts a base integrated circuit package 102, such as a ball grid array package or a land grid array package, having a base substrate 104 with a base top surface 106 and a base bottom surface 108. A first integrated circuit 110 is mounted on the base top surface 106 with an adhesive 112, such as die attach material. The first integrated circuit 110 is coupled to the base top surface 106 by electrical interconnects 114, such as bond wires, solder bumps, solder columns or stud bumps. A base package body 116, such as molding compound, is injection molded around the first integrated circuit 110, the electrical interconnects 114 and a portion of the base top surface 106. System interconnects 118, such as solder balls, solder column interposers or stud bumps, are attached to the base bottom surface 108 for attachment to the next level of system (not shown). An array of a contact pad 120 is distributed in an area around the base package body 116.

A leadframe interposer 122 includes outer leads 124 supported by a molded base 126 that is on the base package body 116. The leadframe interposer 122 is a redistribution layer for signals that would otherwise be unavailable to the system (not shown). An upper integrated circuit package 128, having an upper substrate 130 with a top surface 132 and a bottom surface 134, is mounted in a centered position on the leadframe interposer 122. The upper integrated circuit package 128 has a second integrated circuit 136 mounted on the top surface 132 with the adhesive 112. The second integrated circuit 136 is coupled to the top surface 132 by the electrical interconnects 114. An upper package body 138, such as the molding compound, is injection molded over the second integrated circuit 136, the top surface 132 and the electrical interconnects 114. The system interconnects 118 are attached to the bottom surface 134, of the upper substrate 130. The upper integrated circuit package 128 is mounted on the base integrated circuit package 102, so that the bottom surface 134 of the upper substrate 130 rests on the leadframe interposer 122 and the system interconnects 118. The leadframe interposer 122 provides additional interconnect paths between the upper substrate 130 and the base substrate 104.

Figure 2:
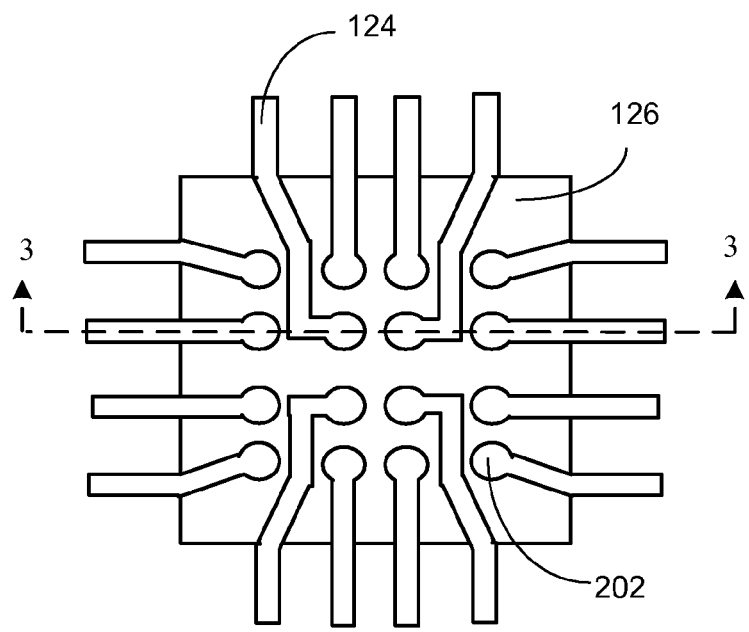
FIG. 2 is a top view of a leadframe interposer for a package-on-package stacking system, in an embodiment of the present invention.

Referring now to FIG. 2, therein is shown a top view of the leadframe interposer 122 for the integrated circuit package-on-package stacking system 100, in an embodiment of the present invention. The top view of the leadframe interposer 122 depicts signal contacts 202 in an array, having the outer leads 124 supported by the molded base 126. A section line 3-3 indicates the portion of the leadframe interposer 122 displayed in FIG. 3. The configuration shown is a four by four array of the signal contacts 202, but this is an example only and the actual number of contacts in the array may be different.

Figure 3:
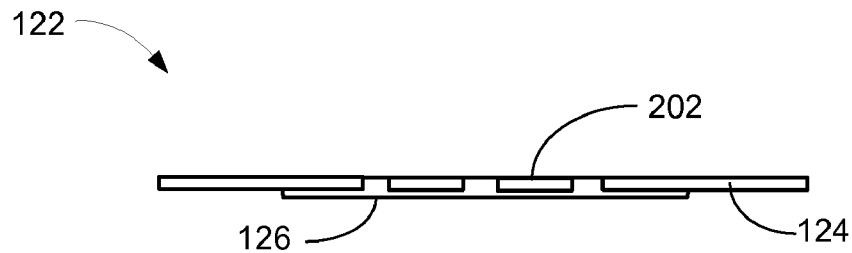
FIG. 3 is a cross-sectional view of the leadframe interposer of FIG. 2 along section line 3-3, before lead bending.

Referring now to FIG. 3, therein is shown a cross-sectional view of the leadframe interposer 122 of FIG. 2 along section line 3-3, before lead bending. The cross-sectional view of the leadframe interposer 122 depicts the signal contacts 202 and the outer leads 124 in a coplanar position. The molded base 126 maintains the relative position of the signal contacts 202 and the outer leads 124. The outer leads 124 may be configured to elevate the molded base 126 to various levels to meet the requirements of different packages.

Figure 4:
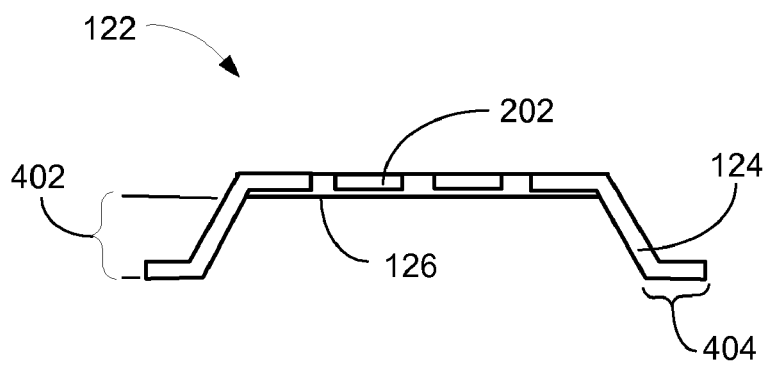
FIG. 4 is a cross-sectional view of the leadframe interposer of FIG. 2 along section line 3-3, after lead bending.

Referring now to FIG. 4, therein is shown a cross-sectional view of the leadframe interposer 122 of FIG. 2 along section line 3-3, after lead bending. The cross-sectional view of the leadframe interposer 122 depicts the outer leads 124 having been bent to support a stack-up height 402 for the base package body 116, of FIG. 1, targeted for the configuration. An extension base 404 is formed on the outer leads 124. The position of the bend for the extension base 404 determines the stack-up height 402 of the molded base 126 and provides a contact surface for connection to the base integrated circuit package 102, of FIG. 1.

Figure 5:
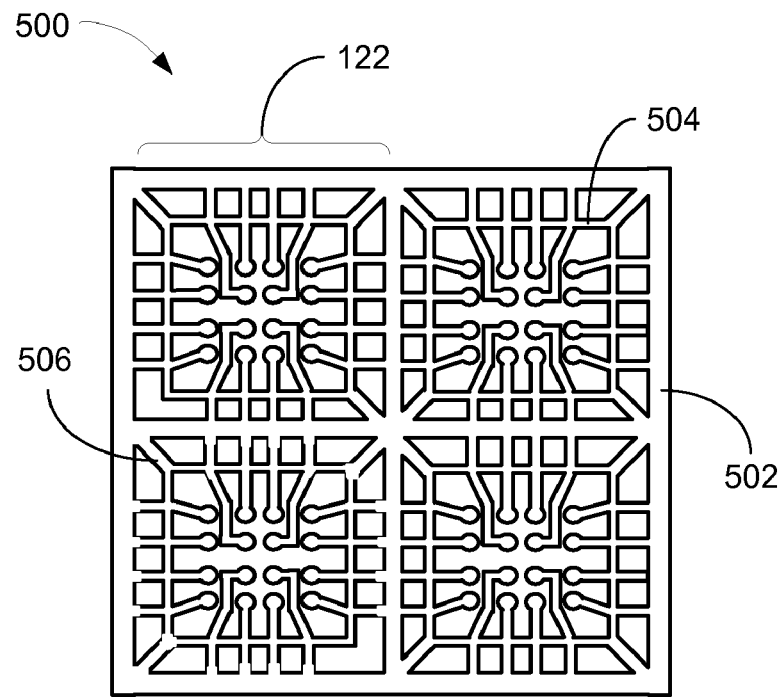
FIG. 5 is a top view of a leadframe for the package-on-package stacking system, in an embodiment of the present invention.

Referring now to FIG. 5, therein is shown a top view of a leadframe 500 for the package-on-package stacking system, in an embodiment of the present invention. The top view of the leadframe 500 depicts four of the leadframe interposer 122, in an unprocessed state. The leadframe 500 is etched, punched or forged from a sheet of conductive material, such as copper, tin, zinc, or an alloy of either copper, tin, or zinc. The leadframe 500 may be plated with other metals, such as gold. Each of the outer leads 124 is supported by a frame piece 502 and a dam bar 504. The dam bar 504 is supported by tie bars 506.

The dam bar 504 acts as a barrier to seal an injection mold (not shown) during the formation of the molded base 126, of FIG. 1. The position of the dam bar 504 defines the extent of the molded base 126. After the molding process is completed, the dam bar 504, the tie bars 506 and the frame piece 502 are removed from the leadframe interposer 122.

Figure 6:
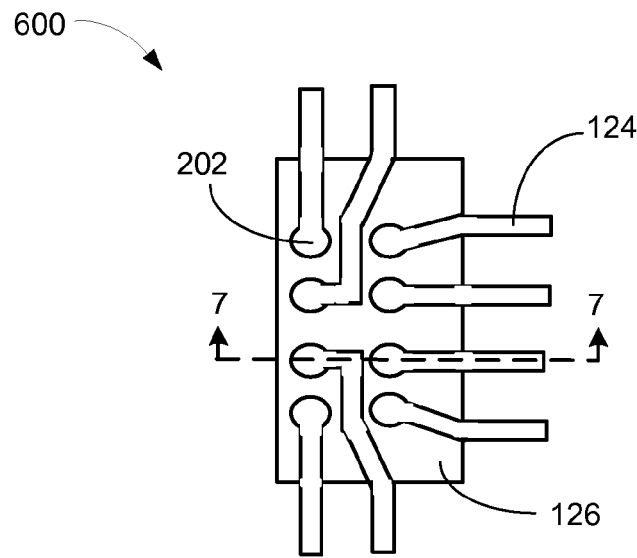
FIG. 6 is a top view of an offset interposer for a package-on-package stacking system in an alternative embodiment of the present invention.

Referring now to FIG. 6, therein is shown a top view of an offset interposer 600 for a package-on-package stacking system in an alternative embodiment of the present invention. The top view of the offset interposer 600 depicts the signal contacts 202 in an array, having the outer leads 124 supported by the molded base 126. A section line 7-7 indicates the portion of the offset interposer 600 displayed in FIG. 7. The configuration shown is a two by four array of the signal contacts 202, but this is an example only and the actual number of contacts in the array may be different.

Figure 7:
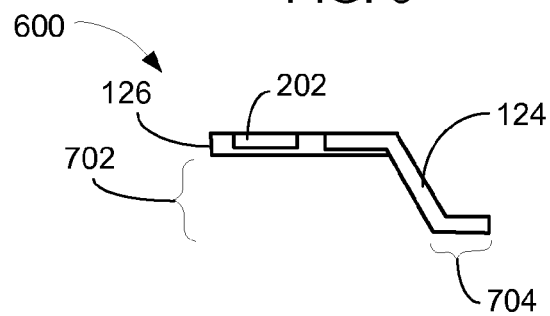
FIG. 7 is a cross-sectional view of the offset interposer of FIG. 6 along section line 7-7.

Referring now to FIG. 7, therein is shown a cross-sectional view of the offset interposer 600 of FIG. 6 along section line 7-7. The cross-sectional view of the offset interposer 600 depicts the outer leads 124 having been bent to support a stack-up height 702 for the base package body 116, of FIG. 1, targeted for the configuration. An extension base 704 is formed on the outer leads 124. The position of the bend for the extension base 704 determines the stack-up height 702 of the molded base 126 and provides a contact surface for connection to the base integrated circuit package 102, of FIG. 1.

Figure 8:
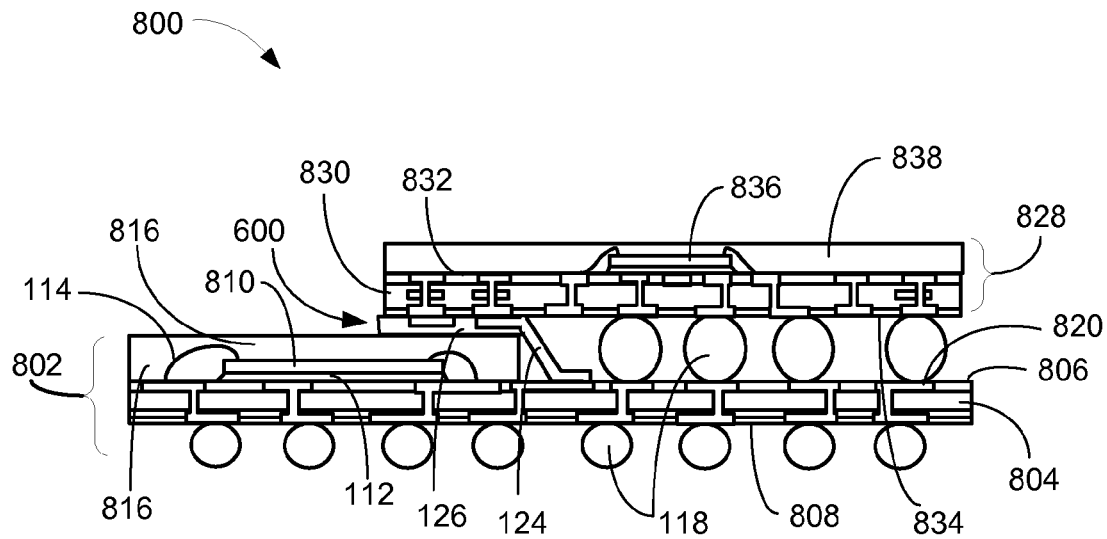
FIG. 8 is a cross-sectional view of the integrated circuit package-on-package stacking system, in an alternative embodiment of the present invention.

Referring now to FIG. 8, therein is shown a cross-sectional view of an integrated circuit package-on-package stacking system 800, in an alternative embodiment of the present invention. The cross-sectional view of the integrated circuit package-on-package stacking system 800 depicts a base integrated circuit package 802, such as a ball grid array package or a land grid array package, having a base substrate 804 with a base top surface 806 and a base bottom surface 808. A first integrated circuit 810 is mounted on the base top surface 806 with the adhesive 112, such as die attach material. The first integrated circuit 810 is coupled to the base top surface 806 by the electrical interconnects 114, such as bond wires, solder bumps, solder columns or stud bumps. A base package body 816, such as molding compound, is injection molded around the first integrated circuit 810, the electrical interconnects 114 and a portion of the base top surface 806. The system interconnects 118, such as solder balls, solder column interposers or stud bumps, are attached to the base bottom surface 808 for attachment to the next level of system (not shown). An array of a contact pad 820 is distributed in an area around the base package body 816.

The offset interposer 600 includes outer leads 124 supported by the molded base 126 that is on the base package body 816. An upper integrated circuit package 828, such as a quad flatpack no-lead (QFN), ball grid array, or land grid array, having an upper substrate 830 with a top surface 832 and a bottom surface 834, is mounted in an offset position on the offset interposer 600. The upper integrated circuit package 828 has a second integrated circuit 836 mounted on the top surface 832 with the adhesive 112. The second integrated circuit 836 is coupled to the top surface 832 by the electrical interconnects 114. An upper package body 838, such as the molding compound, is injection molded over the second integrated circuit 836, the top surface 832 and the electrical interconnects 114. The system interconnects 118 are attached to the bottom surface 834, of the upper substrate 830. The upper integrated circuit package 828 is mounted on the base integrated circuit package 802, so that the bottom surface 834 of the upper substrate 830 rests on the offset interposer 600 and the system interconnects 118. The offset interposer 600 provides additional interconnect paths between the upper substrate 830 and the base substrate 804.

Figure 9:
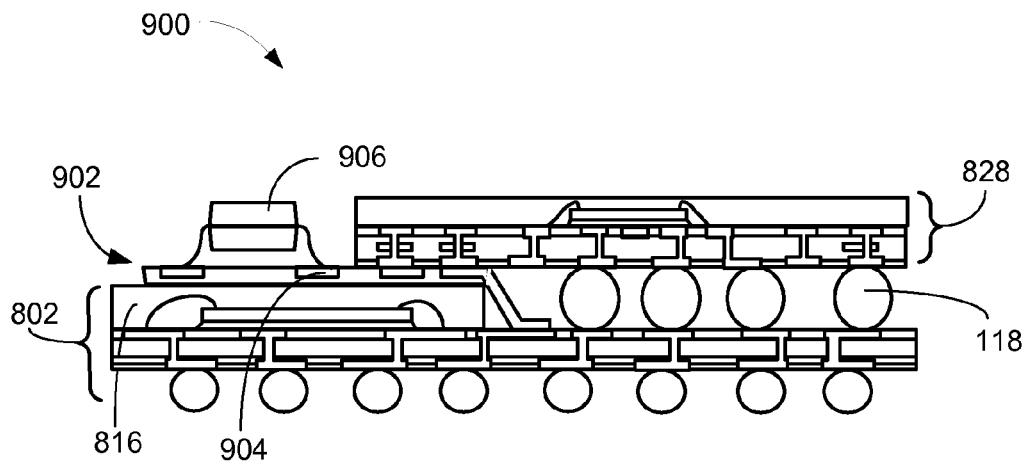
FIG. 9 is a cross-sectional view of an integrated circuit package-on-package stacking system, in another alternative embodiment of the present invention.

Referring now to FIG. 9, therein is shown a cross-sectional view of an integrated circuit package-on-package stacking system 900, in another alternative embodiment of the present invention. The cross-sectional view of the integrated circuit package-on-package stacking system 900 depicts the base integrated circuit package 802 having an extended interposer 902 mounted on the base package body 816. The upper integrated circuit package 828 is supported by and electrically connected to the extended interposer 902 and the system interconnects 118. The extended interposer 902 has additional contact pads 904 that may be used to mount an integrated circuit package 906, such as a QFN, land grid array, or a leaded package with gull-wing or J leads.

Figure 10:
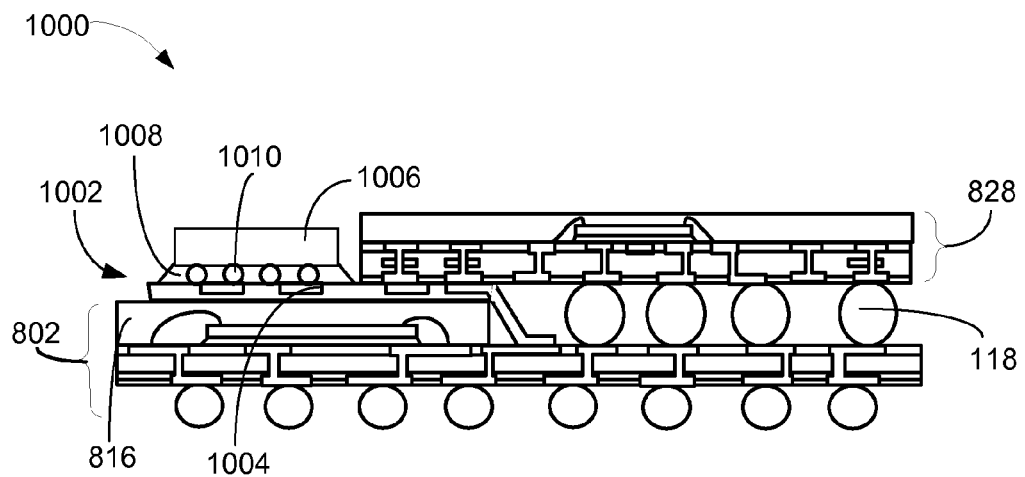
FIG. 10 is a cross-sectional view of an integrated circuit package-on-package stacking system, in yet another alternative embodiment of the present invention.

Referring now to FIG. 10, therein is shown a cross-sectional view of an integrated circuit package-on-package stacking system 1000, in yet another alternative embodiment of the present invention. The cross-sectional view of the integrated circuit package-on-package stacking system 1000 depicts the base integrated circuit package 802 having an extended interposer 1002 mounted on the base package body 816. The upper integrated circuit package 828 is supported by and electrically connected to the extended interposer 1002 and the system interconnects 118. The extended interposer 1002 has additional contact pads 1004 that may be used to mount a flipchip integrated circuit 1006. An underfill material 1008 is used to protect die interconnects 1010, such as solder balls, stud bumps, or solder columns.

Figure 11:
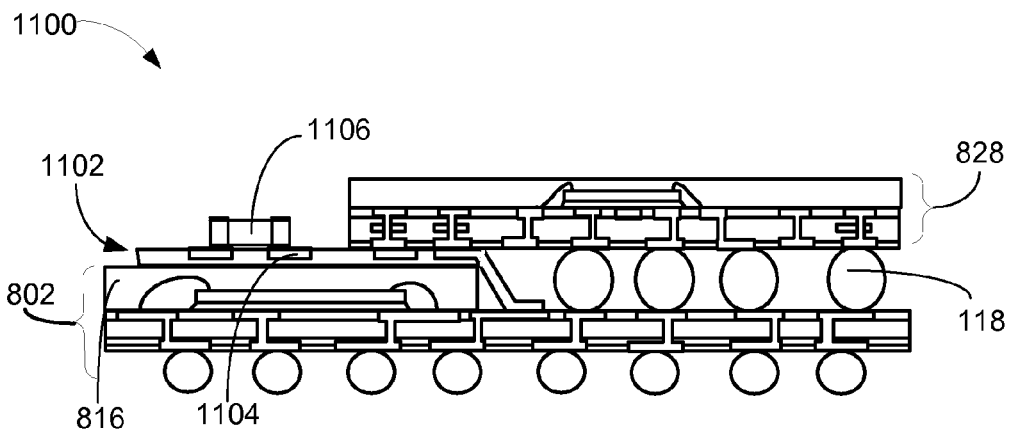
FIG. 11 is a cross-sectional view of an integrated circuit package-on-package stacking system, in still yet another alternative embodiment of the present invention.

Referring now to FIG. 11, therein is shown a cross-sectional view of an integrated circuit package-on-package stacking system 1100, in still yet another alternative embodiment of the present invention. The cross-sectional view of the integrated circuit package-on-package stacking system 1100 depicts the base integrated circuit package 802 having an extended interposer 1102 mounted on the base package body 816. The upper integrated circuit package 828 is supported by and electrically connected to the extended interposer 1102 and the system interconnects 118. The extended interposer 1102 has additional contact pads 1104 that may be used to mount a discrete component 1106, such as a passive component or an active component.

Figure 12:
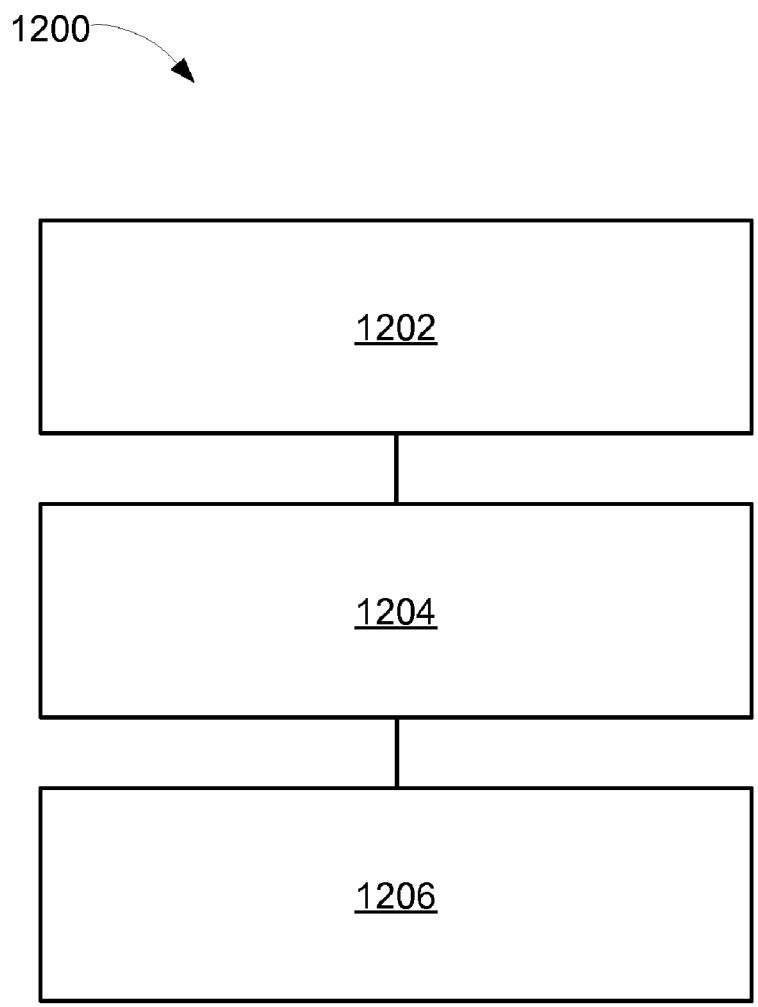
FIG. 12 is a flow chart of a package-on-package stacking system for manufacturing a package-on-package stacking system in an embodiment of the present invention.

Referring now to FIG. 12, therein is shown a flow chart of an integrated circuit package-on-package stacking system 1200, for manufacturing an integrated circuit package-on-package stacking system 100 in an embodiment of the present invention. The system 1200 includes forming a leadframe interposer including: forming a leadframe, forming a molded base on the leadframe, and singulating the leadframe interposer from the leadframe in a block 1202; providing a base integrated circuit package with the leadframe interposer mounted thereon in a block 1204; and providing an upper integrated circuit package on the leadframe interposer in a block 1206.

It has been discovered that the present invention thus has numerous aspects.

A principle aspect that has been unexpectedly discovered is that the present invention provides a signal redistribution layer for contacts, in an integrated circuit package stack, that are over the cover of the lower integrated circuit. Historically these contacts had to be moved to the outer perimeter causing increased contact density and a larger foot print of the package.

Another aspect is the leadframe interposer allows shorter signal paths which can benefit critical signals.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-on-package stacking system of the present invention furnishes important and heretofore unknown and unavailable solutions, capabilities, and functional aspects for developing and manufacturing package-on-package stacked solutions. The resulting processes and configurations are straightforward, cost-effective, uncomplicated, highly versatile and effective, can be surprisingly and unobviously implemented by adapting known technologies, and are thus readily suited for efficiently and economically manufacturing package-on-package stacked devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package-on-package stacking method comprising forming a leadframe interposer, before mounting an integrated circuit on the leadframe interposer, including sequential steps of:
   forming a leadframe having a lead;
   forming a molded base on a portion of the lead;
   singulating the leadframe interposer from the leadframe by cutting a dam bar from the leadframe; and
   bending the lead of the leadframe interposer to support a stack-up height and adjusting the stack-un height by forming an outer lead.

2. The method as claimed in claim 1 further comprising providing a signal contact on the leadframe interposer for providing an electrical connection to an upper integrated circuit package.

3. The method as claimed in claim 1 further comprising forming an extension base on the leadframe interposer.

4. The method as claimed in claim 1 further comprising providing an additional contact on an extended interposer for attaching a discrete component, an integrated circuit package, an integrated circuit die, or a combination thereof.

5. An integrated circuit package-on-package stacking method comprising forming a leadframe interposer, before mounting an integrated circuit on the leadframe interposer, including sequential steps of:
   forming a leadframe having a lead and having an array of leadframe interposers;
   forming a molded base on a portion of the lead and includes forming the molded base on the leadframe interposer;
   singulating the leadframe interposer from the leadframe includes cutting a dam bar and cutting a frame piece from the leadframe; and
   bending the lead of the leadframe interposer to support a stack-up height and adjusting a stack-up height by forming an outer lead includes bending the outer lead in two places.

6. The method as claimed in claim 5 further comprising providing a signal contact on the leadframe interposer for providing the electrical connection to an upper integrated circuit package, in which the signal contact may be gold plated.

7. The method as claimed in claim 5 further comprising forming an extension base on the leadframe interposer includes providing an electrical contact.

8. The method as claimed in claim 5 further comprising providing an additional contact on an extended interposer for attaching a discrete component, an integrated circuit package, an integrated circuit die, or a combination thereof includes providing an additional function on the extended interposer.

* * * * *